(12) United States Patent
Taniguchi (10) Patent No.: US 7,106,047 B2
(45) Date of Patent: Sep. 12, 2006

(54) ELECTRIC CURRENT DETECTION APPARATUS

(75) Inventor: Makoto Taniguchi, Oobu (JP)

(73) Assignee: Denso Corporation, Kariya (JP)

( * ) Notice: Subject to any disclaimer, the term of this patent is extended or adjusted under 35 U.S.C. 154(b) by 86 days.

(21) Appl. No.: 10/890,353

(22) Filed: Jul. 14, 2004

(65) Prior Publication Data

US 2005/0012496 A1    Jan. 20, 2005

(30) Foreign Application Priority Data

Jul. 18, 2003    (JP)    ............................. 2003-276753

(51) Int. Cl.
*G01R 33/07*    (2006.01)
*G01R 15/18*    (2006.01)
*G01R 15/20*    (2006.01)

(52) U.S. Cl. .................. 324/126; 324/127; 324/117 R; 324/117 H (58) Field of Classification Search .................... None
See application file for complete search history.

(56) References Cited

U.S. PATENT DOCUMENTS 4,101,829 A * 7/1978 Gomperts et al. .......... 324/126
4,182,982 A * 1/1980 Wolf et al. .................. 324/127
4,882,538 A * 11/1989 Sato et al. .................. 324/127
5,107,204 A    4/1992 Bullock et al.
2003/0179063 A1* 9/2003 Preusse et al. .............. 336/182

FOREIGN PATENT DOCUMENTS

| JP | A 6-201731 | 7/1994 |
|---|---|---|
| JP | A 6-289060 | 10/1994 |
| JP | A 7-209336 | 8/1995 |
| JP | A 10-177927 | 6/1998 |
| JP | B2 2910184 | 4/1999 |
| JP | A 2002-257866 | 9/2002 |

* cited by examiner

*Primary Examiner*—Paresh Patel
(74) *Attorney, Agent, or Firm*—Oliff & Berridge, PLC (57) ABSTRACT

An electric current detection apparatus has a single magnetic sensor for detecting a first current which flows from a battery and also a second current which flows into or from the battery during different occasions from the first current and is substantially smaller than the first current. The magnetic sensor has a magnetic core surrounding first and second conductors, with the second conductor carrying the second current and with the first conductor being shunted by a third conductor such as to conduct a predetermined proportion of the first current.

16 Claims, 8 Drawing Sheets

(CROSS-SECTION THROUGH A-A)

(CROSS-SECTION THROUGH B-B)

ELECTRIC CURRENT DETECTION APPARATUS

BACKGROUND OF INVENTION

1. Field of Application

The present invention relates to an electric current detection apparatus for detecting values of electric current flow in each of two systems which always have respectively different conduction occasions, where the term "conduction occasion" is used herein to signify a time during which current flow occurs through a specific electrical system or conductor.

In particular, the invention relates to such an electric current detection apparatus that is applicable to two systems having a large difference between the respective dynamic ranges of currents which flow in the two systems. The invention further relates to an electric current detection system, a battery module which combines a current detection function with a storage battery, and a battery status monitoring method, each of which utilize such an electric current detection apparatus.

2. Prior Art Technology

In recent years, with increasing amounts of electrical apparatus being mounted on motor vehicles, the requirements for the amount of electric power that must be supplied to the electrical apparatus from the electrical storage battery (referred to hereinafter simply as the battery) of the vehicle has increased accordingly. At the same time, due to the need to ensure high reliability of the electric power supply of a motor vehicle, advances have been made in technology for monitoring the status of the battery, i.e., for monitoring the SOC (state-of-charge), indicative of the degree to which the battery is charged, and the SOH (state-of-health), indicative of the overall condition of the battery and in particular the remaining energy storage capacity of the battery (referred to in the following simply as the residual capacity).

A typical method of battery status detection is described for example in Japanese Patent Laid-open No. 2910184, wherein a correlation map of the relationships between values of internal resistance of a vehicle battery and values of residual capacity of the battery is prepared and stored beforehand. When the vehicle engine is started, a residual capacity value is calculated using the correlation map, based on the internal resistance of the battery at that time. Thereafter, that residual capacity value is successively incremented or decremented in accordance with successive amounts of discharge current from the battery or of charging current supplied to the battery, to thereby successively update the actual residual capacity value.

The internal resistance of the battery at the time of engine starting is calculated based on the starting current that is supplied from the battery to the starter motor of the vehicle when the engine is being started, and the voltage that appears between the battery terminals at that time.

Figure 10A:
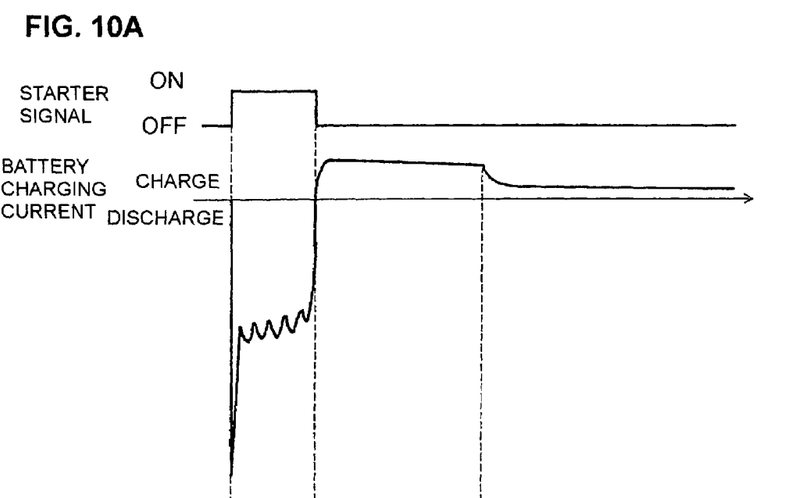
FIGS. 10A, 10B are timing diagrams showing an example of the relationship between battery charge/discharge current flow and a magnetic sensor output signal, in the prior art.

When a vehicle engine is started by using the starter motor, then as shown in FIG. 10A the starter signal is held at a level which will be referred to as the ON level during a time interval t1~t2, during which a very high level of starting current (for example, 500~1000 A) flows, for producing sufficient torque to start the engine. When engine starting has been completed, the generator of the vehicle begins to be driven by the engine to generate electric power, and this initiates charging of the battery by a flow of charging current from the generator. Rapid charging of the battery occurs while the charging current is initially at a high level during the interval from t2~t3 as shown in FIG. 10A.

However the level of charging current at that time (and thereafter) is substantially lower than the starting current, being approximately 200 A or lower.

Figure 10B:
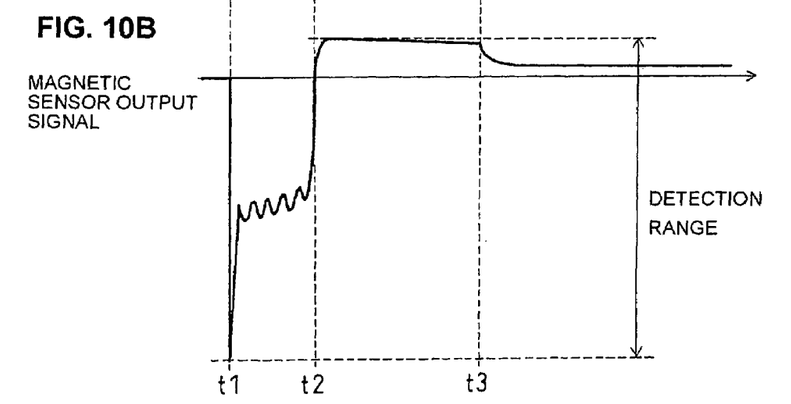

If it is attempted to use a single magnetic sensor to measure the respective values of current that flow in such two systems during two respectively different conduction occasions (i.e., the conduction occasions from t1 to t2 and from t2 to t3, respectively), then since the currents that flow in the two systems have respective dynamic ranges that differ greatly, it is necessary to use a magnetic sensor having a detection range corresponding to the largest of the aforementioned two dynamic ranges, as illustrated in FIG. 10B. However if the detection range is made so large, then the detection resolution will become correspondingly lower, so that problems arise with respect to accuracy of detection when measuring the levels of battery current that flow after engine starting has been completed.

In the prior art, in order to accurately measure the currents which flow in two such different systems whereby the respective currents have dynamic ranges that differ greatly, it has been necessary to use two electric current detection apparatuses which have respectively different detection ranges, or (as described in Japanese Patent Laid-open No. 06-201731) to use a magnetic balance type of electric current detection apparatus that can be switched in detection range.

However if an electric current detection apparatus utilizing two current detectors having respectively different detection ranges is used, then the overall size of the apparatus will become large, so that it is difficult to find space for mounting the electric current detection apparatus in the vehicle, and in addition this is not an efficient measure, from the aspect of manufacturing costs.

On the other hand, if an electric current detection apparatus having the magnetic balance type of current detector is used, with switching of the current detection range being accomplished by varying the offset magnetic flux, it is necessary for the current detector to incorporate a feedback winding and a bias winding, wound around a magnetic core. Hence, the structure becomes complex, so that the manufacturing cost is high. Furthermore, due to the inductance of the feedback winding, the problem arises that the switching response when changing the detection range is poor.

SUMMARY OF THE INVENTION

It is an object of the present invention to overcome the above problems of the prior art, by providing an electric current detection apparatus having a single electric current detector that can accurately detect respective levels of current that flow in two different systems during respectively different conduction occasions, with the respective current flows differing greatly in dynamic range. It is a further objective to provide such an electric current detection apparatus which has a simple configuration and which can thereby be manufactured at low cost.

To achieve the above objectives, according to a first aspect the invention provides an electric current detection apparatus for detecting a first current which flows in a first current path during a first conduction occasion and a second current which is lower than the first current and flows in a second current path during a second conduction occasion which differs from the first conduction occasion, with the electric current detection apparatus comprising a first conductor that is connected in the first current path, a second conductor that is connected in the second current path, a third conductor that is connected in parallel with the first conductor, a magnetic core for forming a magnetic circuit and concentrating a magnetic field produced by flow of the first current in the first conductor and a magnetic field produced by flow of the second current in the second conductor, and a magnetic sensor that is inserted in the magnetic circuit, for detecting a flux density of a magnetic flux that is produced in the magnetic circuit, with the magnetic sensor having a detection range that corresponds to a dynamic range of values of current which flow in the second conductor. The ratio of respective values of resistance of the first conductor and the second conductor is predetermined such that the flux density produced in the magnetic circuit due to current flow through the first conductor is within a detection range of the magnetic sensor, i.e., is of the same order of magnitude as the flux density resulting from current flow through the second conductor.

With such an apparatus, since the first and third conductors are connected in parallel within the first current path, part of the aforementioned first current that flows in the first current path is shunted through the third conductor (which is disposed such as not to influence the magnetic sensor). That is to say, current branching of the first current occurs between the first and third conductors, with a branching ratio that is determined by the respective values of electrical resistance of the first and third conductors. According to this first aspect of the invention, these respective values of electrical resistance are predetermined such that the respective dynamic ranges of magnetic flux density produced in the magnetic circuit due to current flow through the first conductor and due to current flow through the second conductor, respectively, are both within the detection range of the magnetic sensor.

In that way, levels of current flow along the first current path and of current flow along the second current path can each be accurately detected using the same magnetic sensor, even if the respective current levels differ substantially.

Such an electric current detection apparatus is suitable for a vehicle application, with respective first ends of the first, second and third conductors being electrically connected to a positive terminal of the vehicle battery, respective second ends of the first and third conductors electrically connected through the first current path to a first electrical load that is constituted by the starter motor of the vehicle, and a second end of the second conductor electrically connected through the second current path to a second electrical load that is constituted by other equipment of the vehicle. In that way, a single magnetic sensor can be used to detect a high level of current supplied from the battery to the starter motor during respective conduction occasions (i.e., each period during which battery charging is performed) and low levels of current that are supplied from the battery to the second load (or received, as a charging current by the battery), during different conduction occasions from those of the first load (i.e., occurring after engine starting has been completed).

As an alternative configuration, the aforementioned third conductor is omitted. Instead, the second conductor is formed with a coil portion, which is wound around a part of the magnetic circuit, and the number of turns of the coil portion is predetermined such that the flux density which is produced in the magnetic circuit due to the current flow through the second conductor is within the detection range of the magnetic sensor.

In that way, an amplified level of magnetic flux density is produced by current flow through the second conductor. The degree of amplification is proportional to the number of turns of the coil portion of the second conductor, and that number of turns is predetermined such that the magnetic flux produced in the magnetic circuit due to current flow through the second conductor is within the dynamic range of the magnetic sensor. In this case, the magnetic sensor can have a detection range that corresponds to the dynamic range of levels of magnetic flux produced due to current flow in the first conductor.

Hence with such a configuration also, current flow along the first current path and current flow along the second current path, occurring in respectively different conduction occasions, can each be detected by using the same magnetic sensor, irrespective of the fact that the respective dynamic ranges of current flow may differ substantially.

Such an apparatus also may be utilized in a vehicle, with respective first ends of the first conductor and the second conductor being electrically connected to a positive terminal of the vehicle battery (or connected to the vehicle body), a second end of the first conductor electrically connected through the first current path to a first electrical load that is constituted by the starter motor of the vehicle, and a second end of the second conductor electrically connected through the second current path to a second electrical load that is constituted by equipment of the vehicle other than the starter motor.

It can be understood from that use in such a vehicle application is based upon the fact that a flow of normal discharge current from the battery or of charging current to the battery can only occur after engine starting has been completed, i.e., after the flow of charging current has ceased. Specifically, during an engine starting period (constituting an aforementioned first conduction occasion) the magnetic flux sensor detects the magnetic flux density produced in the magnetic circuit due to current flow through the first conductor (i.e., the starting current) and produces an output signal that varies in proportion to the magnetic flux density, and during a period of undefined duration that begins upon completion of the engine starting (constituting an aforementioned second conduction occasion) the magnetic flux sensor detects a magnetic flux density produced in the magnetic circuit due to current flow through the second conductor (i.e., normal discharge current or charging current) and produces an output signal that varies in proportion to the magnetic flux density.

From another aspect, the invention provides an electric current detection system, comprising an electric current detection apparatus according to the present invention having one of the configurations outlined above, together with temperature sensor means for detecting the ambient temperature of the magnetic sensor, and compensation means functioning in accordance with a temperature value that is detected by the temperature sensor means, to apply compensation for a temperature dependency of the magnetic sensor.

In that way even if the magnetic sensor has a temperature dependency, accurate detection of values of magnetic flux and hence accurate detection of current values can be achieved.

Furthermore, the invention provides a battery module suitable for use in a vehicle, consisting of an electric current detection apparatus according to the present invention mounted on a vehicle battery. This has the advantage of a compact configuration, with only a minimum length of connecting lead being required between the electric current detection apparatus and the positive terminal of the battery.

From another aspect, the invention provides a battery status monitoring method consisting of:

(a) utilizing an electric current detection apparatus according to the present invention to detect the value of starting current that flows in a starter motor from a battery of a vehicle when starting of the vehicle engine is performed, and detecting the battery voltage during the engine starting, (c) detecting an initial status quantity indicative of an initial status of the battery (i.e., the residual capacity at the time of engine starting) based on the acquired values of starting current and battery voltage, and (d) subsequent to the engine starting, repetitively incrementing the initial status quantity by respective quantities that are based on successively obtained values of discharge current or charging current of the battery.

In that way, the SOH of the battery can be accurately determined each time that engine starting occurs, and can be continuously monitored after engine starting has been completed.

DESCRIPTION OF PREFERRED EMBODIMENTS

First Embodiment

Figure 1:
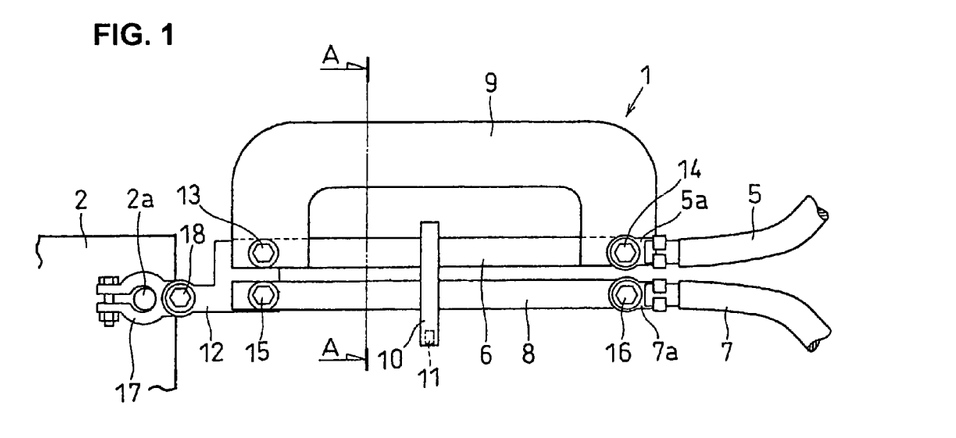
FIG. 1 is a plan view showing the configuration of an electric current detection apparatus according to a first embodiment of the invention.

FIG. 1 is a plan view of an electric current detection apparatus 1 according to a first embodiment. This is applicable for example to a battery status monitoring system such as that shown in FIG. 7 (described in more detail hereinafter), for detecting a starting current that flows from a battery 2 to a starter motor 3 (also shown in FIG. 7) when starting of a vehicle engine is performed, and for monitoring a charging current that flows from a generator 4 of the vehicle into the battery 2, and moreover for detecting a discharge current that flows from the battery 2 to other electrical equipment of the vehicle (such as headlamps, air conditioner, navigation apparatus, etc.).

Figure 2:
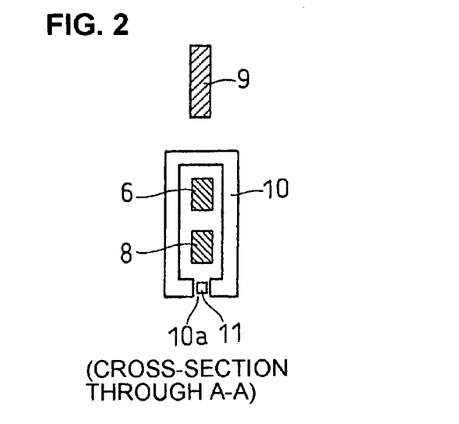
FIG. 2 is a cross-sectional view in elevation taken through a plane A—A indicated in FIG. 1.

FIG. 2 is a cross-sectional view taken through a plane A—A indicated in FIG. 1. As shown in FIG. 1, the electric current detection apparatus 1 is made up of a 1st conductor 6 that is connected to a 1st supply lead 5 of a first current path, a 2nd conductor 8 that is connected to a 2nd supply lead 7 of a second current path, a 3rd conductor 9 that is connected in parallel with the 1st conductor 6, a magnetic core 10 which forms a magnetic circuit that peripherally surrounds both the 1st conductor 6 and the 2nd conductor 8, and a magnetic flux sensor 11 for detecting the level of magnetic flux density that is produced in the magnetic circuit.

The 1st supply lead 5 is a power supply cable for supplying electric power from the battery 2 to the starter motor 3 when engine starting is being performed. A starting current having a maximum amplitude of approximately 1000 amperes flows through the 1st supply lead 5 during the time interval t1~t2 shown in FIG. 3A, during engine starting. The 2nd supply lead 7 is a power supply cable for supplying a charging current from the generator 4 to the battery 2 after engine starting has been completed, and for supplying discharge current from the battery 2 to other electrical equipment of the vehicle.

After the vehicle ignition switch has been turned on, a current at a level of 200 A or less flows in the 2nd supply lead 7, other than during engine starting. Such a current which flows in a conduction occasion other than engine starting will be generally referred to in the following as a "normal current", signifying a discharge current supplied from the battery 2 to equipment other than the starter motor or a charging current that is supplied to the battery 2 from the generator 4.

Each of the 1st conductor 6, 2nd conductor 8 and 3rd conductor 9 is formed of a material having a high coefficient of electrical conductance such as copper, formed in a flat bar shape with a rectangular cross-section. The 1st conductor 6 and 2nd conductor 8 have respectively similar cross-sectional areas and lengths, and pass through the inner periphery of the magnetic core 10. The 3d conductor 9 has a larger cross-sectional area than the 1st conductor 6 and the 2nd conductor 8. As shown in FIG. 1, the 3d conductor 9 is formed in a curved shape, with an L-configuration at each end.

The 1st conductor 6 and 3rd conductor 9 are each fixedly attached at one end thereof by a bolt 13 to a linking electrode 12, while respective opposite ends of the 1st conductor 6 and 3rd conductor 9 are each fixedly attached by a bolt 14 to a terminal 5a, which is connected to the 1st supply lead 5. One end of the 2nd conductor 8 is fixedly attached to the linking electrode 12 by a bolt 15, while the other end of the 2nd conductor 8 is fixedly attached to a terminal 7a by a bolt 16, with the terminal 7a being connected to the 2nd supply lead 7.

The linking electrode 12 is fixedly attached by a bolt 18 to a battery terminal 17, which is connected to the positive electrode 2a of the battery 2.

The magnetic core 10 concentrates, in a magnetic circuit, the magnetic flux that is produced due to current that flows through the 1st conductor 6 and the magnetic flux that is produced due to current flow through the 2nd conductor 8. The magnetic core 10 is formed of a magnetic material having a very high magnetic permeability, such as ferrite, permalloy, etc. As shown in FIG. 2, the magnetic core 10 is shaped with a gap 10a, in which is located a magnetic flux sensor 11, which is thereby placed within the magnetic circuit.

The magnetic flux sensor 11 serves to detect the magnetic flux density which arises in the gap 10a of the magnetic core 10, and produces a sensor signal such as a voltage signal, in accordance with the magnetic flux density. The magnetic flux sensor 11 can be implemented as a compound semiconductor Hall effect element, formed of a material such as GaAs, InSb, etc., or as a 1-chip integrated circuit having a Hall effect element formed in a silicon chip of a processor circuit, or as a magnetoresistive element, etc.

The magnetic flux sensor 11 has a detection range that corresponds to the dynamic range of the current that flows in the 2nd conductor 8. Alternatively stated, the detection range of the magnetic flux sensor 11 is suitable for accurate detection of currents that flow in the 2nd conductor 8 and have levels of 200 A or less. In addition, the ratio of the respective resistance values of the 1st conductor 6 and the 3rd conductor 9 (i.e., the ratio of the respective cross-sectional areas of these) is predetermined such that the magnetic flux which is produced in the magnetic circuit due to current flow through the 1st conductor 6 will be within the detection range of the magnetic flux sensor 11.

Figure 3A:
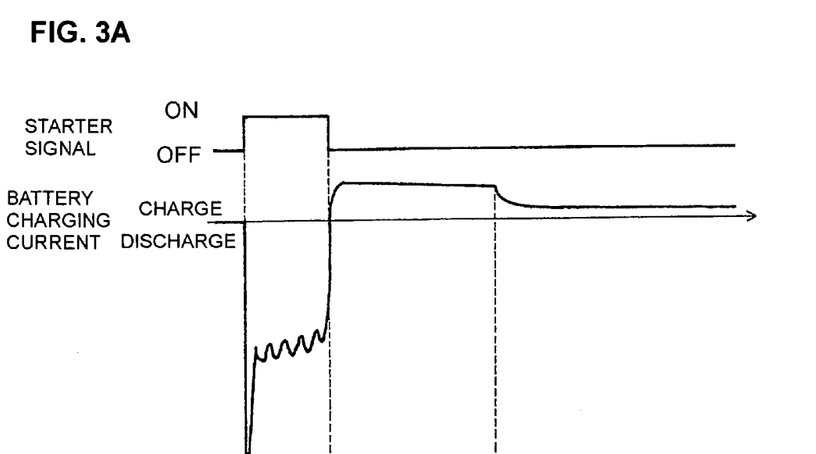
FIGS. 3A, 3B are timing diagrams showing the relationship between a magnetic sensor output signal and charge/discharge current flows of a battery, with the first embodiment.
Figure 3B:
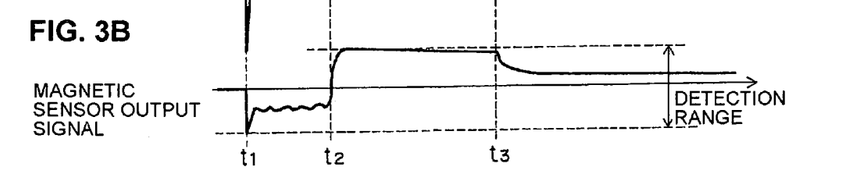

The operation of the electric current detection apparatus 1 of this embodiment will be described in the following. Firstly, when the vehicle engine is to be started, a starter switch (not shown in the drawings) is set on, whereby an internal operating relay of the starter motor is tripped, and the starter signal is then held at the ON level during the time interval from t1~t2 as shown in FIG. 3A. During that time interval, a starting current is supplied from the battery 2 through the 1st supply lead 5 to the starter motor 3. The starting current has a maximum (peak) value that is approximately 1000 A, with the actual maximum value depending upon the engine cranking condition.

The starting current is branched from the linking electrode 12 through the 1st conductor 6 and the 3rd conductor 9, with the branching ratio being determined by the ratio of the respective cross-sectional areas of the 1st conductor 6 and 3rd conductor 9. Specifically, designating the cross-sectional area of the 1st conductor 6 as S1 and that of the 3rd conductor 9 as S3, and designating the starting current value as Is, the corresponding value of current I1 that flows in the 1st conductor 6 is obtained from equation (1) below:

$$I1 = S1/(S1+S3) \cdot Is \quad (1)$$

Hence, if Is is 1000 A, and S1:S3=1:4, then I1=200 A.

Alternatively stated, the 3rd conductor 9 is connected in parallel with the 1st conductor 6 and outside the magnetic circuit, so that a predetermined proportion of the starting current by-passes the magnetic circuit, thereby reducing the number of ampere-turns of the starting current which actually produce magnetic flux in the magnetic circuit.

When engine starting has been completed, the generator 4 begins to be driven by the engine to generate electricity, and a high level of charging current begins to flow from the generator 4 to the battery 2 through the 2nd supply lead 7 and 2nd conductor 8, to rapidly replenish the charge which has been used in starting the engine. This rapid charging condition of the battery 2 continues during the interval t2~t3 illustrated in FIG. 3A. During that interval, the charging current level is approximately 200 A or less. If the value of I1 is set as approximately 200 A as described above, then the magnetic flux that is produced in the magnetic circuit due to current flow I1 through the 1st conductor 6 and the magnetic flux that is produced in the magnetic circuit due to current flow I2 through the 2nd conductor 8 will be of approximately similar magnitudes.

The starting current Is can be obtained by secondary derivation, from the current I1 that flows in the 1st conductor 6, by using the following equation (2):

$$Is = (S1+S3)/S1 \cdot I1 \quad (2)$$

With the first embodiment described above, since the starting current having a maximum value of approximately 1000 A flows in the 1st supply lead 5 only during a corresponding conduction occasion (i.e., an engine starting period) and the normal current of approximately 200 A or less flows in the 2nd supply lead 7 only during a corresponding conduction occasion (i.e., subsequent to completion of engine starting), the electric current detection apparatus distinguishes between the flows of starting current and of normal current based on the fact that these occur during respectively different conduction occasions.

Furthermore due to the fact that the 1st conductor 6 and 3rd conductor 9 are connected in parallel and are connected in common to the 1st supply lead 5, the starting current flows through the 1st conductor 6 and the 3rd conductor 9 as respective branches, with the branching ratio being determined by the ratio of the respective cross-sectional areas of the 1st conductor 6 and 3rd conductor 9, i.e., by the respective resistance values of these.

With the above embodiment, the respective resistance values of the 1st conductor 6 and 3rd conductor 9 are predetermined such that the current which flows in the 1st conductor 6 is approximately equal to the current that flows in the 2nd conductor 8, while the magnetic flux sensor 11 is configured to have a detection range that approximately corresponds to the dynamic range of the current that flows in the 2nd conductor 8. In that way, it becomes possible for the single magnetic sensor 11 to be used for detecting the current that flows in the 1st conductor 6 with a similar degree of accuracy to detection of the current which flows in the 2nd conductor 8.

Hence with the above embodiment, the electric current detection apparatus 1, using only a single magnetic sensor having a very simple configuration, can accurately measure the respective values of current that flow in two systems in respectively different conduction occasions even when the respective currents have greatly different dynamic ranges, such as is the case with the starting current and the normal levels of charge or discharge current that flow subsequent to completion of engine starting, which occur in the case of a vehicle battery as described above.

Moreover with the above embodiment, it is not necessary to provide a high density winding for use in bypass adjustment of the magnetic core 10 to implement such an electric current detection apparatus, so that such an apparatus can be manufactured at lower cost than is possible for example with a prior art apparatus that uses a magnetic balance type of current detector with detection range changeover.

Second Embodiment

Figure 4:
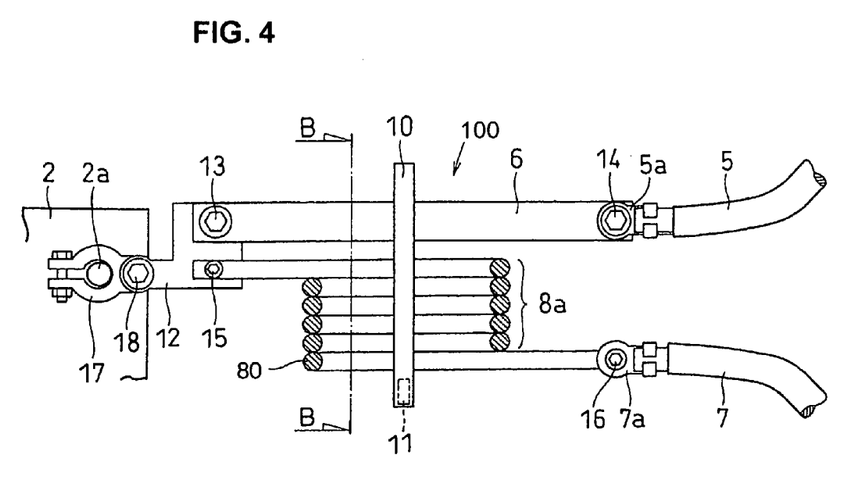
FIG. 4 is a plan view showing the configuration of an electric current detection apparatus according to a second embodiment of the invention.

FIG. 4 is a plan view of an electric current detection apparatus, designated by numeral 100, according to a second embodiment. In FIG. 4, components corresponding to components in the electric current detection apparatus 1 of FIG. 1 are indicated by reference numerals respectively corresponding to those in FIG. 1, and detailed description of these will be omitted. With the first embodiment described above, the 1st conductor 6 and the 3rd conductor 9 are connected mutually in parallel and are connected in common to the 1st supply lead 5. Hence at the time of engine starting, the starting current branches through the 1st conductor 6 and the 3rd conductor 9, thereby reducing the proportion of the starting current that flows through the first conductor 6. However with the second embodiment, there is no reduction of the proportion of the charging current that flows through the 1st conductor 6 during engine starting. Instead, the magnetic flux that is generated by the flow of normal (or charging) current through the 2nd conductor is amplified. The following description will be mainly concerned with points of difference between the first and second embodiments.

The 2nd embodiment does not include the 3rd conductor 9 of the first embodiment, with only the 1st conductor 6 being connected to the 1st supply lead 5, and so carrying all of the starting current during engine starting. In the same way as for the first embodiment, the 1st conductor 6 is formed of a flat bar of rectangular cross-sectional shape, attached by bolt 13 to the linking electrode 12 at one end, and attached to the terminal 5a of the 1st supply lead 5 by bolt 14 at the other end.

In place of the 2nd conductor 8 of the first embodiment, this embodiment includes a 2nd conductor 80 which is formed of wire that is covered by an electrically insulating film. One end of the 2nd conductor 80 is fixedly attached to the linking electrode 12 by bolt 15, and the other end is fixedly attached to the terminal 7a of the 2nd supply lead 7 by the bolt 16.

Figure 5:
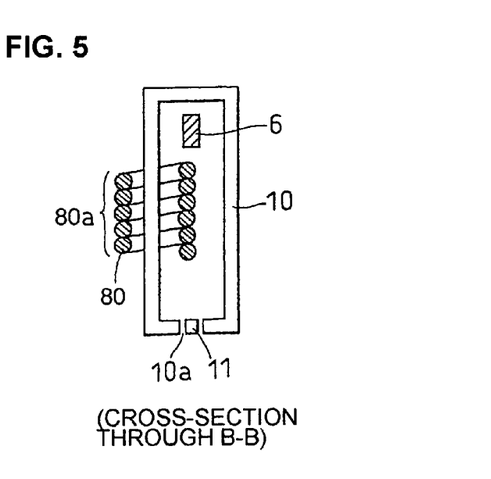
FIG. 5 is a cross-sectional view in elevation taken through a plane B—B indicated in FIG. 4.

As shown in FIG. 5, which is a cross-sectional view in the plane B—B indicated in FIG. 4, a portion of the 2nd conductor 80 is formed as a coil 80a which is wound around a part of the magnetic core 10, and hence around the magnetic circuit. In the same way as for the first embodiment, the magnetic core 10 is formed with a gap 10a, constituting a gap in the magnetic circuit, into which is inserted the magnetic flux sensor 11.

The magnetic flux sensor 11 has a detection range corresponding to the dynamic range of the starting current that flows in the 1st conductor 6, i.e., with the detection range being appropriate for accurately detecting current values of the order of 1000 A. The coil portion 80a of the 2nd conductor 80 has a number of turns that is predetermined such that the magnetic flux density produced in the magnetic circuit of the magnetic core 10 due to current flow through the 2nd conductor 80 is within the detection range of the magnetic flux sensor 11.

The operation of this embodiment is as follows. Designating the value of current that flows in the 2nd conductor 8 as I2, the number of turns of the coil portion 80a of 2nd conductor 80 as n, the magnetic field strength as H2, the magnetic permeability of the magnetic core 10 as μ, the cross-sectional area of the magnetic core 10 as S, magnetic path length as L, and the total magnetic flux density as B2, the following relationships are true:

$$H2 = n \cdot I2/L \ [A/m] \quad (3)$$

$$\begin{aligned} B2 &= \mu \cdot H2 \ [Wb] \\ &= \mu \cdot n \cdot I2/L \end{aligned} \quad (4)$$

The relationship between the number of turns n of the coil portion 80a of 2nd conductor 80 and the amount of magnetic flux that is produced in the magnetic core 10 by the flow of current through the 2nd conductor 80 is obtained from the above equations (3) and (4). From these equations it can be understood that the total amount of magnetic flux B2 that is produced in the gap 10a of the magnetic circuit, due to current flow through the 2nd conductor 80, is proportional to the number of turns n of the coil portion 80a of 2nd conductor 80, and so can be arbitrarily set by altering that number of turns. Hence, assuming that the maximum value of the starting current is 1000 A and the maximum value of the normal current (as defined hereinabove for the first embodiment) is 200 A, then a value of 5 is suitable for the number of turns n. In that way, the amount of magnetic flux that is produced due to the normal current flow through the 2nd conductor 80 and the amount of magnetic flux that is produced due to the starting current flow through the 1st conductor 6 will be of similar magnitudes.

Alternately stated, with this embodiment the number of ampere-turns of the normal current that produce magnetic flux in the magnetic circuit is increased by a predetermined proportion, determined by the number of turns of the coil portion 80a.

In that way it is made possible with the embodiment to calculate the value of normal current flow through the 2nd conductor 8 by dividing the value of current I2 that is detected by the magnetic flux sensor 11 by the number of turns n of the coil portion 80a of 2nd conductor 80.

With the electric current detection apparatus 100 of the second embodiment, in the same way as for the electric current detection apparatus 1 of the first embodiment, the single electric current detection apparatus 100 can accurately measure the respective values of current that flow in two systems in respectively different conduction occasions, even when the dynamic ranges of the respective currents of the two systems are substantially different. Moreover this is accomplished without the need for a complex structure having high manufacture cost, e.g., with it being unnecessary to provide a high density winding for bypass adjustment, as is required when utilizing a prior art type of magnetic balance current detector that is capable of detection range switching as described hereinabove.

Third Embodiment

Figure 6:
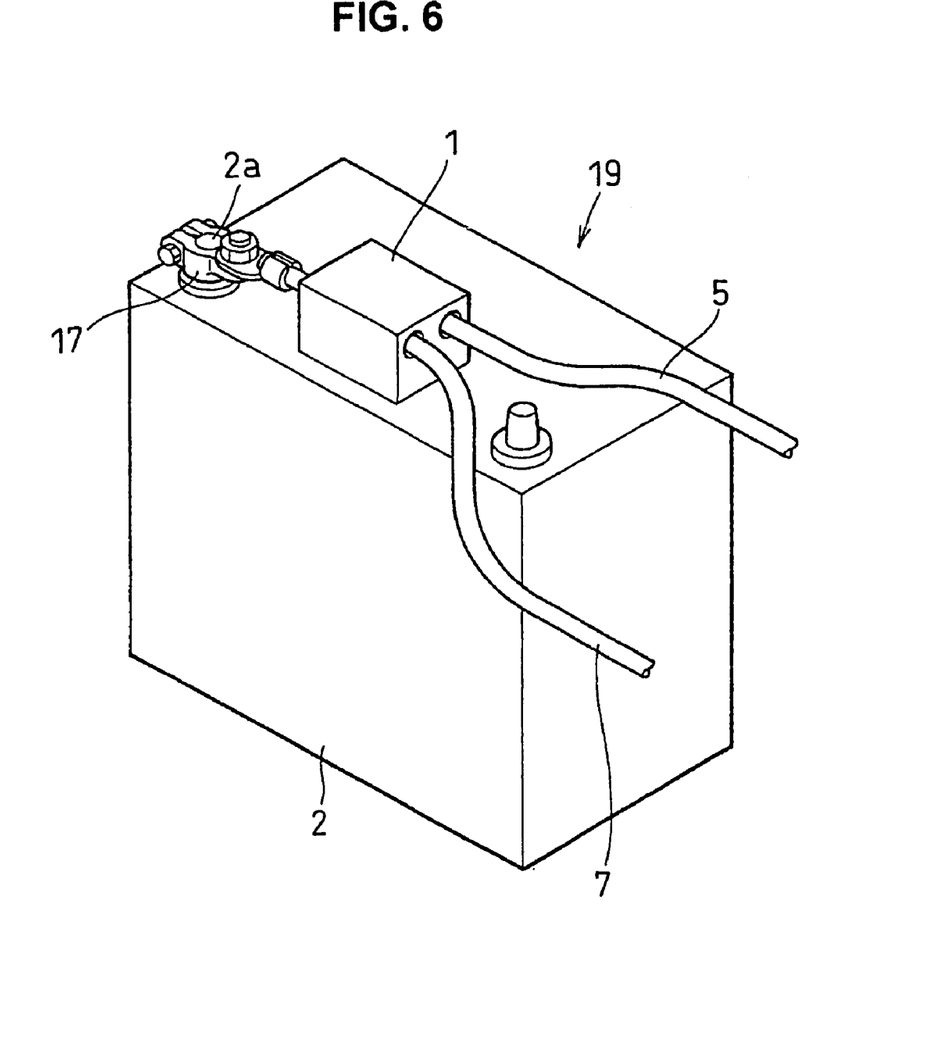
FIG. 6 is an oblique view of a battery module according to a third embodiment.

FIG. 6 is an oblique view of a battery module 19 according to a third embodiment of the invention. With this embodiment the electric current detection apparatus 1 of the first embodiment (or the electric current detection apparatus 100 of the second embodiment) attached within a case that is formed of a material such as synthetic resin, cast aluminum, etc., is mounted on a battery 2 as shown, to thereby constitute a battery module 19. Since the electric current detection apparatus 1 is directly mounted on the battery 2, the connecting lead between the electric current detection apparatus 1 and the terminal 17 the battery 2 can be very short, and space saving can be achieved.

Fourth Embodiment

Figure 7:
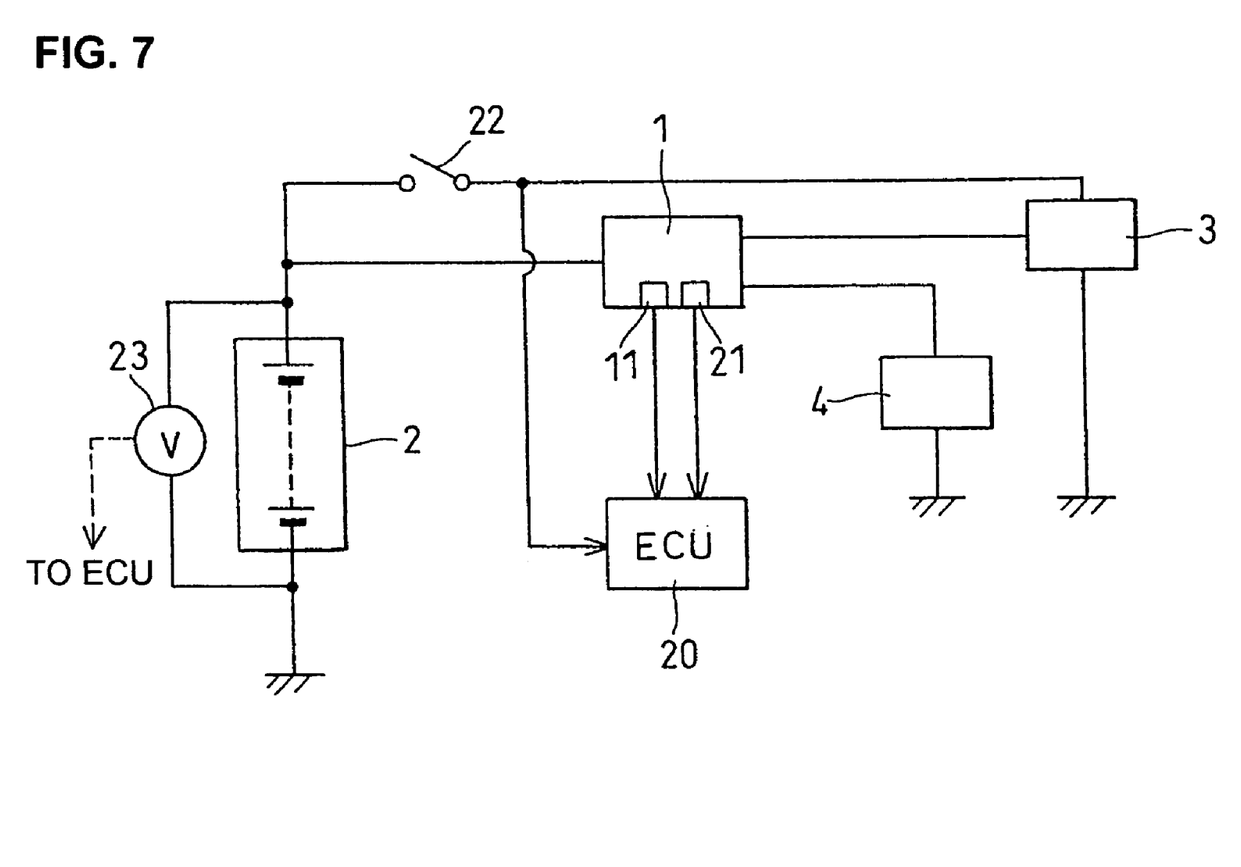
FIG. 7 is a block diagram of a battery status monitoring system according to a fourth embodiment.

FIG. 7 is a system block diagram of a battery status monitoring system according to a fourth embodiment of the invention. With the fourth embodiment, the battery status monitoring system monitors the internal status of the battery 2 based on the values of current that are measured by using the electric current detection apparatus 1 of the first embodiment described above (or the electric current detection apparatus 100 of the fourth embodiment). The battery status monitoring system shown in FIG. 7 is constituted by a combination of the electric current detection apparatus 1 and a battery monitoring ECU (electronic control unit) 20 which uses information supplied from the electric current detection apparatus 1 to ascertain the residual capacity of the battery 2.

As described above, the electric current detection apparatus 1 (or electric current detection apparatus 100) can accurately detect the values of starting current and of normal current of the battery 2, which occur in respectively different conduction occasions as described hereinabove. The magnetic flux sensor 11, configured of a device such as a Hall effect element, exhibits a temperature dependency in its characteristics. In order to compensate for that temperature dependency, a temperature sensor 21 is mounted close to the magnetic flux sensor 11, to detect the ambient temperature of the magnetic flux sensor 11 and to supply this temperature information as an output signal to the ECU 20.

Figure 8:
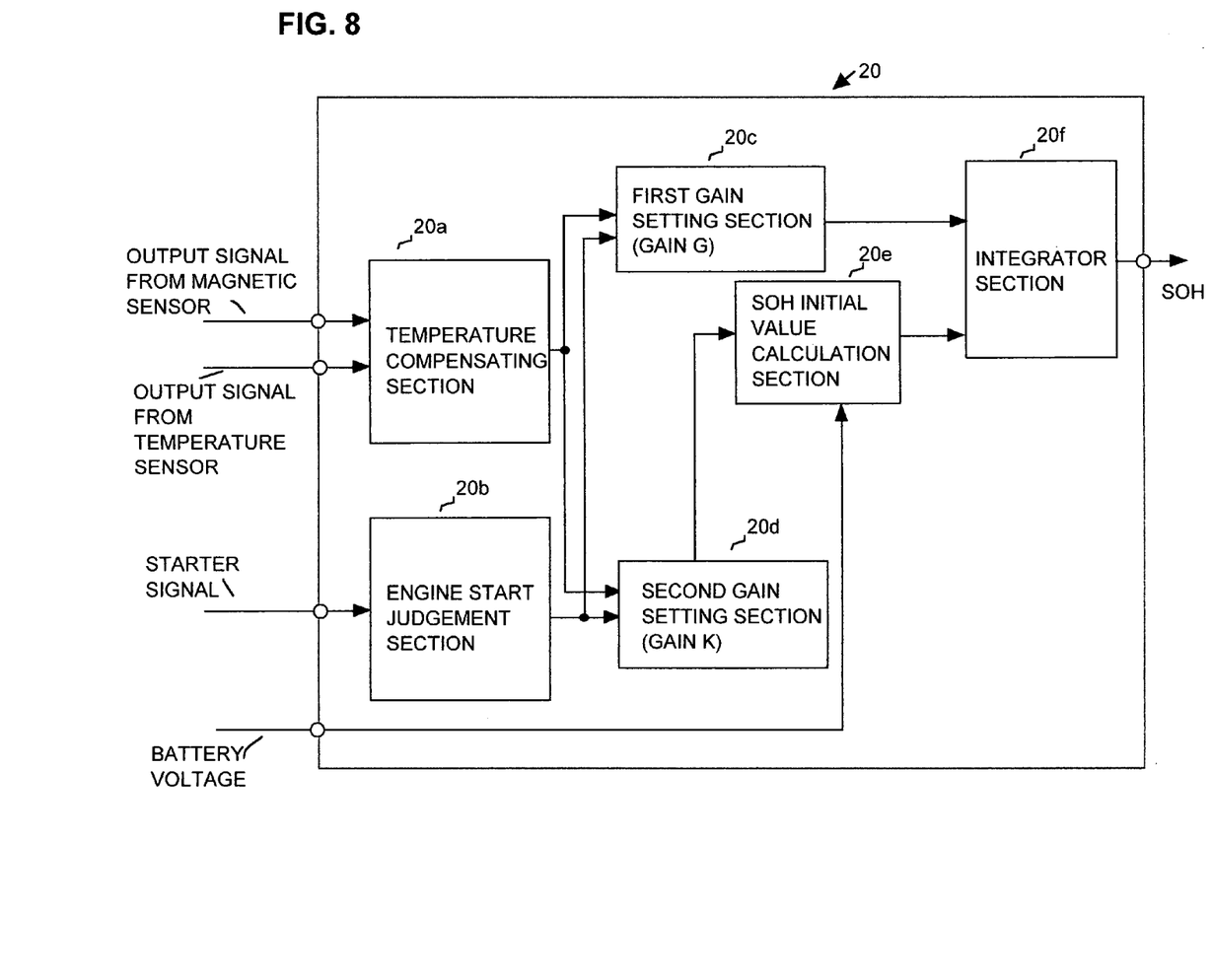
FIG. 8 is a block diagram illustrating the internal configuration of a battery status ECU of the fourth embodiment.

The configuration of the battery status monitoring ECU 20 is illustrated in the block diagram of FIG. 8. As shown, the battery status monitoring ECU 20 acquires the output signal from the magnetic flux sensor 11, the output signal from the temperature sensor 21, the starter signal (i.e., an ON/OFF signal from the switch 22 shown in FIG. 7) and the terminal voltage of the battery 2, as detected by a voltmeter 23. The latter terminal voltage will be referred to in the following simply as the battery voltage. As shown in FIG. 8, the battery status monitoring ECU 20 is internally provided with a temperature compensating section 20a, an engine start judgement section 20b, a first gain setting section 20c, a second gain setting section 20d, an SOH initial value calculation section 20e, and an integrator section 20f, etc.

The temperature compensating section 20a applies temperature compensation for the temperature characteristic of the magnetic flux sensor 11 in accordance with the temperature in the vicinity of the magnetic flux sensor 11, as detected by the temperature sensor 21. The engine start judgement section 20b judges when starting of the engine is being performed, based on the starter signal. The 1st gain setting section 20c calculates a value of gain G that is to be applied to the output signal from the magnetic flux sensor 11, after temperature compensation has been applied to that signal by the temperature compensating section 20, with the resultant gain-adjusted temperature-compensated signal being supplied to the SOH initial value calculation section 20e.

When the engine start judgement section 20b confirms that the starter signal has gone from the ON to the OFF level (subsequent to that signal having been confirmed as being at the ON level), it supplies a control signal to the 2nd gain setting section 20d, which then calculates a value K of gain that is to be applied to the temperature-compensated output signal of the magnetic flux sensor 11, that is supplied from the temperature compensating section 20a through the 2nd gain setting section 20d to the integrator section 20f.

The methods of calculating the values of gain G and K will be described in the following. These methods differ in accordance with whether the electric current detection apparatus 1 of the first embodiment or the electric current detection apparatus 100 of the second embodiment is utilized.

(a) When Electric Current Detection Apparatus 1 of First Embodiment is Utilized

In this case, the level of current which flows in the 1st conductor 6 during engine starting is determined by the ratio of the cross-sectional areas of the 1st conductor 6 and the 3rd conductor. Designating the cross-sectional area of the 1st conductor 6 as S1 and that of the 3rd conductor 9 as S3, the value of gain K that is to be applied when the starter signal is at the ON level is obtained from the following equation (5):

$$K=(S1+S3)/S1 \qquad (5)$$

Since the normal current flow (as defined hereinabove) is not detected at that time, the value of gain G is set as zero.

After the starter signal changes from the ON to the OFF level, the value of gain G which is then set is determined by the sample interval duration $\Delta t$, which is the duration of each interval in which the output signal from the magnetic flux sensor 11 is acquired by the battery status monitoring ECU 20. Since the starting current is not detected at that time, the value of gain K is set as zero.

(b) When Electric Current Detection Apparatus 100 of Second Embodiment is Utilized With the electric current detection apparatus 100 of the second embodiment, since the starting current that flows in the 1st conductor 6 during engine starting is detected by the magnetic flux sensor 11, the value of gain K is set as 1, when it is confirmed that the starter signal is at the ON level. Since the normal current flow is not detected at that time, the value of gain G is set as zero.

On the other hand, designating the value of current that is detected by the magnetic flux sensor 11 during normal current flow as I2, and the number of turns in the coil portion 80a of 2nd conductor 80 of the 2nd conductor 80 as n, then the actual normal current value is I2/n. Hence, after it has been confirmed that the starter signal has changed from the ON to the OFF level, the value of gain G is set as $\Delta t/n$. Since the starting current is not detected at that time, the value of gain K is set as zero.

Figure 9:
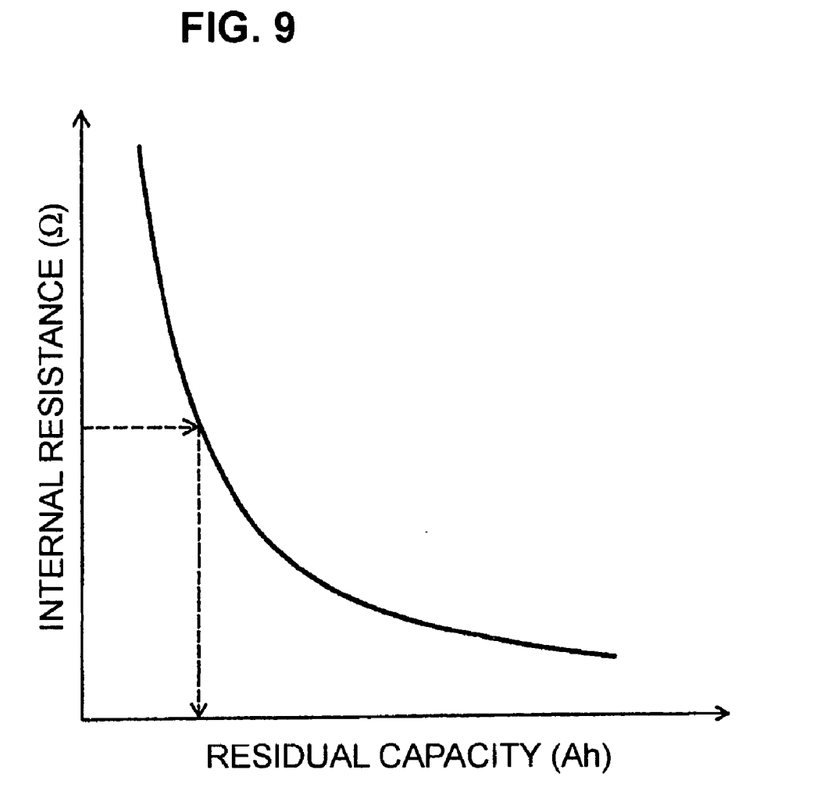
FIG. 9 is a graph showing a relationship between values of battery internal resistance and residual capacity of a battery, utilized with the fourth embodiment.

The initial value calculation section 20e has stored therein a correlation map that expresses the relationship between values of residual capacity of the battery 2 and corresponding values of internal resistance of that battery. That relationship is shown as a graph in FIG. 9. Each time that engine starting is performed, the initial value calculation section 20e calculates the value of internal resistance R of the battery 2, and obtains from the correlation map the initial value SOH0 of the residual capacity SOH at the time of starting. The internal resistance R0 of the battery 2 is calculated using the following equation (6), after the value V1 of battery voltage prior to engine starting, the value V2 of battery voltage during engine starting, and the starting current Is have been obtained:

$$R0=(V1-V2)/Is \qquad (6)$$

If a zero value is supplied to the initial value calculation section 20e from the 2nd gain setting section 20d (i.e., when the gain K is set as 0) then the initial value calculation section 20e continues to output the most recently calculated value of residual capacity (i.e., calculated prior to K becoming 0). That is to say, the initial value calculation section 20e derives an updated initial value of battery residual capacity at each engine starting conduction occasion.

As shown by the following equations (7) and (8), the integration section 20f obtains the amount of consumed electricity (i.e., ampere-hours consumed) of the battery by first multiplying the value of battery current after engine starting has been performed (i.e., the current I2 that flows in the 2nd conductor 8) by the gain G. Thereafter it successively adds each of the values of consumed electricity thereby obtained to the initial value SOH0 that was calculated for the battery 2 by the initial value calculation section 20e, to thereby obtain successive updated values for the residual capacity SOH of the battery 2. The following equation (7) applies when the electric current detection apparatus 1 of the first embodiment is utilized, while the following equation (8) applies when the electric current detection apparatus 100 of the second embodiment is utilized.

$$SOH = SOH0 + \Sigma(I2 \cdot \Delta t) \quad (7)$$

$$SOH = SOH0 + \Sigma(I2 \cdot \Delta t/n) \quad (8)$$

In that way, the battery status monitoring ECU 20 calculates the internal resistance R0 of the battery 2 each time that engine starting occurs, and then obtains the initial value SOH0 of the residual capacity of the battery 2 at the time of engine starting (using the aforementioned correlation map), and thereafter sequentially increments the residual capacity by successive amounts of consumed electricity (I2·Δt) of the battery 2. Real-time monitoring is thereby achieved of the status quantity SOH, indicating the residual capacity of the battery 2 after engine starting has been performed.

The values of SOH that are calculated by the battery status monitoring ECU 20 can for example be used to control the generator 4. Specifically, when the SOH is above a predetermined level (thereby indicating that the charge status of the battery 2 is satisfactory), priority can be given to regenerative operation. That is to say, when the vehicle is to be decelerated, the amount of power generated by the generator 4 is increased to thereby achieve regenerative braking, and conversely when the vehicle is to be accelerated, the generating of power by the generator 4 is halted.

Normally when the vehicle is decelerating, no injection of fuel into the engine cylinders is performed, and the motive energy of the vehicle is transferred from the vehicle wheels through the transmission to rotate the engine. Hence, even if the amount of generated electric power is increased during deceleration, this will not result in an increased amount of fuel being consumed for generating the increased electric power.

On the other hand during acceleration, injection of fuel into the engine cylinders is performed until a target value of vehicle speed is achieved. If electricity were to be generated by the generator 4 during acceleration, then additional fuel would be consumed, due to the torque required for the engine to drive the generator 4. Hence if generating of electric power is halted during vehicle acceleration, then the amount of fuel consumed for electrical generating can be economized. Furthermore during acceleration, the power that was generated during a preceding interval of deceleration is held stored in the battery 2, and so can be supplied from the battery 2 to the electrical equipment of the vehicle.

Such a form of control is unfavorable from the aspect of stability of supply of electric power, since an additional load is placed on the battery 2 when electrical generation by the generator 4 is halted. Hence, it is necessary to continuously monitor the status (i.e., SOH) of the battery 2, and when the SOH falls below a predetermined value, inhibit halting of electric power generation by the generator 4. In addition, the system can readily be configured to notify the vehicle driver when the SOH of the battery has fallen to an excessively low value.

ALTERNATIVE EMBODIMENTS

As can be understood from the first and second embodiments above, an electric current detection apparatus according to the present invention is preferably configured with a magnetic core 10 which concentrates the magnetic field that is produced by current flow through the 1st conductor 6 and the 2nd conductor 8, with the magnetic flux density being detected by the magnetic flux sensor 11. However it should be noted that it would also be possible to use an alternative form of magnetic sensor, e.g., which employs a magnetic balance type of current detection method, such as is described in the aforementioned Japanese Patent Laid-open No. 06-201731.

It should thus be understood that various modifications to the embodiments described above could be envisaged, which fall within the scope claimed for the present invention as set out in the appended claims.

What is claimed is:

1. An electric current detection apparatus for detecting a first current which flows in a first current path during a first conduction occasion and a second current which is smaller than said first current and flows in a second current path during a second conduction occasion which differs from said first conduction occasion, the apparatus comprising:
    a first conductor that is connected in said first current path,
    a second conductor that is connected in said second current path,
    a third conductor that is connected in parallel with said first conductor,
    a magnetic core for forming a magnetic circuit to concentrate a magnetic field produced by a current flow through said first conductor and a magnetic field produced by a current flow through said second conductor, and
    a magnetic sensor adapted for detecting a magnetic flux density or a magnetic field that is produced in said magnetic circuit, said magnetic sensor having a detection range that corresponds to a dynamic range of values of said current flow through said second conductor;
    wherein a ratio of respective values of electrical resistance of said first conductor and said third conductor is predetermined such that said flux density which is produced in said magnetic circuit due to said current flow through said first conductor is within a detection range of said magnetic sensor.

2. An electric current detection apparatus according to claim 1, wherein:
    respective first ends of said first conductor, said second conductor and said third conductor are electrically connected to a positive terminal of a battery that is mounted in a vehicle or to a body of said vehicle,
    respective second ends of said first conductor and said third conductor are electrically connected through said first current path to a first electrical load that is constituted by first equipment of said vehicle, and
    a second end of said second conductor is electrically connected through said second current path to a second electrical load that is constituted by second equipment of said vehicle.

3. An electric current detection apparatus according to claim 2, wherein said first electrical load comprises a starter motor that is operable to start an engine of said vehicle, and said second electrical load comprises by an electrical generator and other electrical equipment of said vehicle.

4. An electric current detection apparatus according to claim 3 wherein:
    during an engine starting period, constituting said first conduction occasion, said magnetic flux sensor detects a magnetic flux density or a magnetic field produced in said magnetic circuit due to current flow through said first conductor and produces an output signal that varies in proportion to said magnetic flux density or magnetic field, and during a period that begins upon completion of said engine starting, constituting said second conduction occasion, said magnetic flux sensor detects a magnetic flux density or a magnetic field produced in said magnetic circuit due to current flow through said second conductor and produces an output signal that varies in proportion to said magnetic flux density or magnetic field.

5. An electric current detection system, comprising:
an electric current detection apparatus according to claim 1, temperature sensor means for detecting an ambient temperature of said magnetic sensor, and
compensation means functioning in accordance with a temperature value that is detected by said temperature sensor means, to apply compensation for a temperature coefficient of said magnetic sensor.

6. A battery module comprising, in combination:
an electric current detection apparatus according to claim 1, and
a vehicle battery having said electric current detection apparatus mounted thereon.

7. A battery status monitoring method comprising:
detecting a value of starting current that flows in a starter motor from a battery of a vehicle when starting of a engine of said vehicle is performed, and detecting a value of voltage of said battery during said engine starting,
detecting an initial status quantity indicative of an initial status of said battery, based on said values of starting current and battery voltage, and
subsequent to said engine starting, repetitively incrementing said initial status quantity, by respective quantities that are derived based on successively obtained values of discharge current and charging current of said battery;
wherein said starting current is detected by an electric current detection apparatus according to claim 1.

8. An electric current detection apparatus comprising:
a first current path for supplying electric power from an electric power source to a first load,
a second current path for supplying electric power from the electric power source to a load that is smaller than said first load,
a magnetic sensor, disposed to be influenced by a first magnetic field produced by a current that flows in said first current path and to produce an output signal in accordance with said first magnetic field, and disposed to be influenced by a second magnetic field produced by a current that flows in said second current path, for producing an output signal in accordance with said second magnetic field, and
adjustment means for applying adjustment whereby said first magnetic field and said second magnetic field have variation ranges that are of similar extent.

9. An electric current detection apparatus according to claim 8, wherein a conduction occasion of said first load and a conduction occasion of said second load are mutually different.

10. An electric current detection apparatus according to claim 9, comprising discrimination means for evaluating an output signal produced from said magnetic sensor respectively differently in accordance with whether said output signal is produced during said conduction occasion of said first load or is produced during said conduction occasion of said second load.

11. An electric current detection apparatus according to claim 8, wherein a conduction period in which current is supplied to said first load is of limited duration.

12. An electric current detection apparatus according to claim 11, comprising discrimination means for evaluating an output signal produced from said magnetic sensor respectively differently in accordance with whether or not said output signal is being produced during a conduction period in which current is being supplied to said first load.

13. An electric current detection apparatus according to claim 8, wherein said first load comprises a starter motor of a vehicle and said second load comprises electrical equipment of said vehicle other than said starter motor.

14. An electric current detection apparatus according to claim 8, wherein said adjustment means comprises means for adjusting a number of ampere-turns corresponding to a magnetic field that acts on said magnetic sensor.

15. An electric current detection apparatus according to claim 14, wherein said adjustment means comprises current-branching means for effecting branching of a current that flows in said first current path, to thereby adjust said number of ampere-turns.

16. An electric current detection apparatus according to claim 14, wherein said adjustment means comprises a coil that is connected in said second current path, with said number of ampere-turns being determined by a number of turns constituting said coil.

* * * * *